(12) United States Patent
Mazur

(10) Patent No.: US 8,092,860 B2
(45) Date of Patent: Jan. 10, 2012

(54) TOPOGRAPHICALLY SELECTIVE OXIDATION

(75) Inventor: Stephen Mazur, Wilmington, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 972 days.

(21) Appl. No.: 12/047,990

(22) Filed: Mar. 13, 2008

(65) Prior Publication Data

US 2008/0226824 A1 Sep. 18, 2008

Related U.S. Application Data

(60) Provisional application No. 60/894,487, filed on Mar. 13, 2007.

(51) Int. Cl.
*B05D 3/04* (2006.01)
*B05D 3/12* (2006.01)

(52) U.S. Cl. ......... 427/240; 427/256; 427/337; 427/425

(58) Field of Classification Search .................. 427/240, 427/425, 256, 337
See application file for complete search history.

(56) References Cited

U.S. PATENT DOCUMENTS

| | | | | |
|---|---|---|---|---|
| 5,633,208 | A * | 5/1997 | Ishikawa | 438/699 |
| 6,387,764 | B1 * | 5/2002 | Curtis et al. | 438/296 |
| 6,949,431 | B2 * | 9/2005 | Lee | 438/253 |
| 2005/0020052 | A1 * | 1/2005 | Lee et al. | 438/613 |

* cited by examiner

*Primary Examiner* — Kirsten Jolley

(57) ABSTRACT

Methods for oxidizing organic compounds coated or adsorbed on a topographically patterned solid surface are provided. The methods can be used to selectively remove the organic compounds from the non-recessed areas.

10 Claims, 3 Drawing Sheets

TOPOGRAPHICALLY SELECTIVE OXIDATION

CROSS-REFERENCE TO RELATED APPLICATION

This application claims priority under 35 U.S.C. §119 from U.S. Provisional Application Ser. No. 60/971,327, filed Sep. 11, 2007.

FIELD OF THE INVENTION

The invention is directed to methods for oxidizing organic compounds coated or adsorbed on a topographically patterned solid surface to selectively remove the organic compounds from the non-recessed areas. The invention is further directed to the removal of 3-mercapto-1-propane sulfonic acid from a Cu surface by reaction with aqueous ozone.

BACKGROUND

Various processes require a textured or topographically patterned solid surface where chemical composition and/or physical properties, such as catalytic activity or wetting characteristics, differ on recessed and non-recessed areas of the surface. For example, variations in the wetting characteristics on recessed and non-recessed areas of printing plates are exploited to selectively accept and/or transfer ink. Such variations can be achieved by selectively contacting or coating the non-recessed areas with surfactants, polymers or chemical reagents such as oxidizing agents. However, when the difference in elevation of recessed and non-recessed areas is small, for example less than 1 micron, mechanical methods for applying or removing coatings, surfactants or reagents are often impractical or insufficiently selective.

Interconnections on integrated circuits are fabricated by the Cu damascene process in which the interconnect circuit pattern is lithographically etched into the surface of a dielectric layer on the surface of the wafer. The etching creates "recessed areas" in the dielectric layer that can be several nanometers to several microns in depth. The remaining surface of the dielectric layer forms "non-recessed areas" that surround the "recessed areas." The pattern is then coated with thin conformal layers of a barrier metal, such as Ta, followed by Cu. Additional Cu is then electroplated over the entire surface of a wafer to fill completely the recessed areas with Cu.

In order to assure complete filling of the smallest recessed areas, the electroplating chemistry incorporates an electrocatalyst, most commonly 3-mercapto-1-propane sulfonic acid (MPS), a salt of MPS, or a corresponding disulfide. These electrocatalysts adsorb to the Cu surface and increase the rate of Cu electrodeposition relative to areas of bare Cu lacking an adsorbed electrocatalyst. This effect is amplified in very small recessed areas because the surface concentration of the electrocatalyst increases during filling. Because the electrocatalyst is present on all surfaces of the wafer, in the course of filling larger recessed areas, excess Cu is deposited everywhere and must be removed.

Chemical mechanical polishing (CMP) can be used to remove the MPS from the non-recessed areas before ECD, but it also tends to remove some of the thin layer of Cu on the non-recessed areas and can lead to defects in the final product.

Alternatively, the MPS-coated wafer can be exposed to strong oxidizing reagents such as $K_2FeO_4$ or $H_2O_2$ in bulk solution before ECD to convert the strongly adsorbing thiol group of MPS to more weakly adsorbing sulfinic or sulfonic acid groups. Although this method may not affect the thin layer of Cu, the extent of oxidation and removal of MPS from the recessed and non-recessed areas is nearly equal, resulting in little or no difference in the rates of subsequent ECD.

Ozone is a strong oxidizing agent that can be readily generated in the gas phase from oxygen by electrical discharge. When dissolved in water, ozone decomposes rapidly to a mixture of short-lived intermediates, including superoxide ($O_2^-$), hydroxyl (HO) and peroxy ($HO_2$) radicals, and is useful as a biological disinfectant and for removing photoresist polymers from silicon wafers and liquid crystal displays. Neither ozone nor aqueous ozone has been used in a commercial process to selectively remove absorbed organic materials from non-recessed areas of a topographically patterned surface.

A method is needed that removes electrocatalysts from the non-recessed areas of a surface containing recessed and non-recessed areas, without removing electrocatalyst from the recessed areas and which removes little or no Cu from the surface. More generally, a method is needed for selectively removing organic compounds coated or adsorbed on the non-recessed portions of a topographically patterned solid surface.

FIGURES

SUMMARY OF THE INVENTION

Figure 1A:
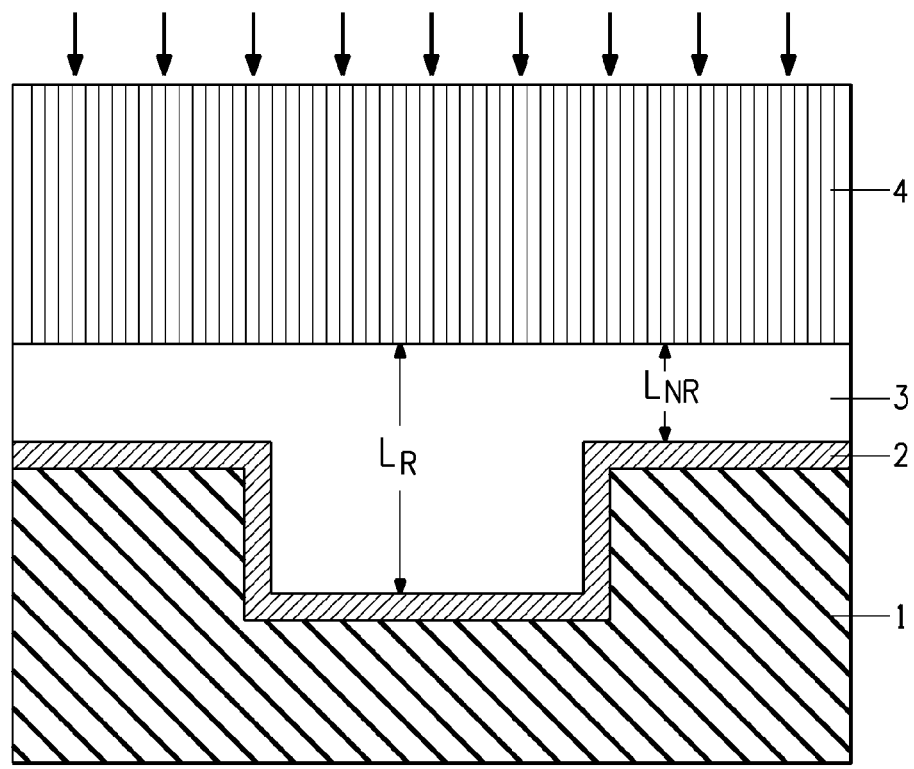
FIG. 1A is a schematic diagram showing the relationship of a porous ozone diffuser poised to deliver gaseous ozone to a topographically patterned surface.

One aspect of the present invention is a process for selectively removing adsorbed organic compositions from non-recessed areas of a topographically patterned substrate comprising recessed and non-recessed areas, comprising:

a. coating the recessed and non-recessed areas of the substrate with a sufficient amount of a liquid hydrophilic solution to at least fill the recessed areas and to cover the non-recessed areas, wherein the solution has a viscosity greater than 10 centipoise;

b. providing a hydrophobic ozone diffuser comprising:
  i. a vessel enclosing a volume that is at least partially filled with ozone gas; and
  ii. an ozone-permeable, hydrophobic membrane which forms a surface of the vessel,
wherein the membrane has an inner surface and an hydrophobic outer surface, and the inner surface is in contact with the ozone gas in the vessel;

c. contacting the coated substrate with the outer surface of the ozone-permeable, hydrophobic membrane of the diffuser to form a layer of liquid hydrophilic solution less than 400 nm thick between the membrane and the non-recessed areas of the substrate; and d. delivering ozone through the membrane to the non-recessed areas.

DETAILED DESCRIPTION

One embodiment of this invention is a process for selectively oxidizing and removing an organic compound from the non-recessed areas of a topographically patterned surface comprising recessed and non-recessed areas.

For example, the process can be used to remove an adsorbed layer of MPS selectively from the non-recessed areas on a Cu-coated semiconductor wafer while leaving the MPS layer substantially intact in recessed areas. When the resulting wafer is subjected to ECD, Cu can be deposited into the recessed features faster than on the non-recessed areas because the MPS is still present in the recessed areas. This allows the recessed areas of the wafer to be substantially completely filled with Cu, with less Cu being deposited on the non-recessed areas. This can avoid the need to remove excess Cu from non-recessed areas in subsequent wafer processing steps.

In one embodiment, a topographically patterned substrate comprising recessed and non-recessed areas is coated with a liquid hydrophilic solution so that the recessed areas are completely filled with the solution and there is a layer of solution covering the raised areas. The membrane portion of an ozone diffuser is then brought into contact with the substrate, forming a layer of hydrophilic liquid solution between the non-recessed areas of the substrate and the surface of the diffuser that is less than about 400 nm thick.

In one embodiment, the liquid hydrophilic solution comprises water, one or more solvents, and optional additives. Suitable solvents are selected from the group consisting of alcohols, polyols, amines and polyamines. Suitable additives include tetramethylammonium hydroxide, potassium hydroxide, and/or copper sulfate. Such additives are used in small quantities, less than 10 wt %, based on the weight of the liquid hydrophilic solution. In one embodiment, the solvent is selected from the group consisting of glycerol and triethanolamine, and the additives are tetramethylammonium hydroxide and copper sulfate. Mixtures of solvents can also be used.

In one embodiment, a conventional coating method such as spin-coating is used to deposit a sub-micron layer of a non-volatile hydrophilic liquid solution such as of glycerol, or a water soluble solid such as sucrose, onto the topographically patterned substrate. The non-volatile liquid or water soluble solid can be coated from solution in a volatile solvent that is lost during spin-coating. When this coating is subsequently exposed to a gas stream of ozone at a constant relative humidity <100%, it equilibrates to a constant water content and thickness which may be much less than 1 micron. For example, when a 100 nm thick coating of glycerol is equilibrated with ozone gas which has been sparged through a solution comprising equal volumes of water and glycerol, the coating rapidly absorbs just enough water to reach the same composition and retains a constant thickness of 200 nm. The coatings of aqueous solution can also be formulated to include other non-volatile, water-soluble components such as surfactants, catalysts, radical scavengers, transition metal ions and acids or bases.

Spin-coating can be used as described above to wet the surface of the substrate and fill the recessed areas with hydrophilic solution. But because the upper surface of the coating initially conforms to the underlying topography, an inconveniently long time may be required for it to relax to a flat surface under the forces of gravity and surface tension. However, once the flat surface is achieved, one can selectively oxidize the organic materials that are adsorbed onto the non-recessed areas without also oxidizing organic materials in the recessed areas. A "flat" surface is one in which the thickness of the liquid layer over the non-recessed areas is essentially constant and the thickness of the liquid layer over the recessed areas is equal to the depth of the recess plus the thickness of the liquid layer over the non-recessed areas.

Although one can achieve a suitable liquid layer over the patterned substrate using techniques such as spin coating, it is preferable to avoid the long equilibration times by using a porous, ozone-permeable, hydrophobic diffuser that spans a plurality of the topographic features. By contacting the coated, topographically patterned substrate with the membrane portion of the diffuser, an essentially uniform layer of thickness $L_{NR}$ of hydrophilic solution is established between the membrane and the non-recessed areas of the substrate. The thickness of the layer of hydrophilic solution between the membrane portion of the diffuser and the recessed areas of depth $L_{RD}$ is $L_{NR}+L_{RD}$.

The ozone diffuser comprises an ozone-permeable membrane of hydrophobic material that prevents the hydrophilic solution from penetrating into the pores of the membrane. The membrane should be flexible enough that it conforms to and remains in contact with the non-recessed areas when in use, but is also stiff enough that it does not make contact with the recessed areas. When ozone gas flows through the pores of the porous membrane under a modest hydrostatic pressure, for example 0.3 psi, a constant concentration of ozone is maintained at the interface with the diffuser.

One type of ozone-permeable membrane that is suitable for use in a diffuser comprises a PTFE layer containing 0.5 micron pores and a polypropylene screen for supporting the PTFE layer. Suitable examples include Millipore type FH membrane filters and Pall TF450 membrane filters. One feature of these membranes is that they have a textured surface due to the polypropylene support. When using membranes with a textured surface, it is desirable to constantly move the diffuser across the surface of the wafer. In this way, variations in solution layer thickness due to roughness of the membrane can be averaged out and uniform removal of the adsorbed organic composition can be achieved.

In one embodiment of the invention, ozone diffuses through the ozone-permeable membrane and is thereby delivered to the non-recessed areas of the substrate. When the ozone contacts the hydrophilic liquid, it decomposes to form reactive free radicals. The reactive free radicals are short-lived (with half-lives generally less than 1 millisecond), but are much more reactive than ozone itself for oxidizing organic compounds. The rate of oxidation can therefore be increased by increasing the rate of ozone decomposition, for example by increasing the pH of the liquid layer, thereby increasing the steady-state concentration of reactive radicals.

In various embodiments, the aqueous solution has a pH>7, or a pH>9, or a pH>12. Decomposition of ozone in aqueous solution is catalyzed by base. Therefore increasing the pH of an ozone-sparged aqueous solution to pH>9 decreases the steady-state concentration of ozone while increasing the steady-state concentration of reactive radicals. The pH of the aqueous solution can be adjusted by the choice of solvent (e.g., by the use of amines) and by the use of basic solvents or additives such as ethanolamine, triethanolamine, or tetramethylammonium hydroxide.

As an illustration of one embodiment of this invention, FIG. 1A shows a schematic representation of a topographically patterned substrate 1 with an organic coating 2 covered by a viscous, hydrophilic solution 3 (i.e., a liquid with viscosity greater than 10 centipoise which is completely miscible with water) exposed to a source of ozone gas. When the upper surface of the solution is flat and substantially parallel to the non-recessed areas, then the thickness $L_R$ over recessed areas is greater than the thickness $L_{NR}$ over non-recessed features. One can maximize the difference in oxidation rates between recessed and non-recessed areas by maximizing the ratio $L_R/L_{NR}$. The rate of MPS removal by aqueous ozone can be increased by minimizing the thickness of liquid layer separating the gas/liquid interface from the substrate. This is a consequence of the decomposition and the consequent decrease in concentration of ozone and of the radical intermediates as they diffuse away from the gas/liquid interface.

Figure 1B:
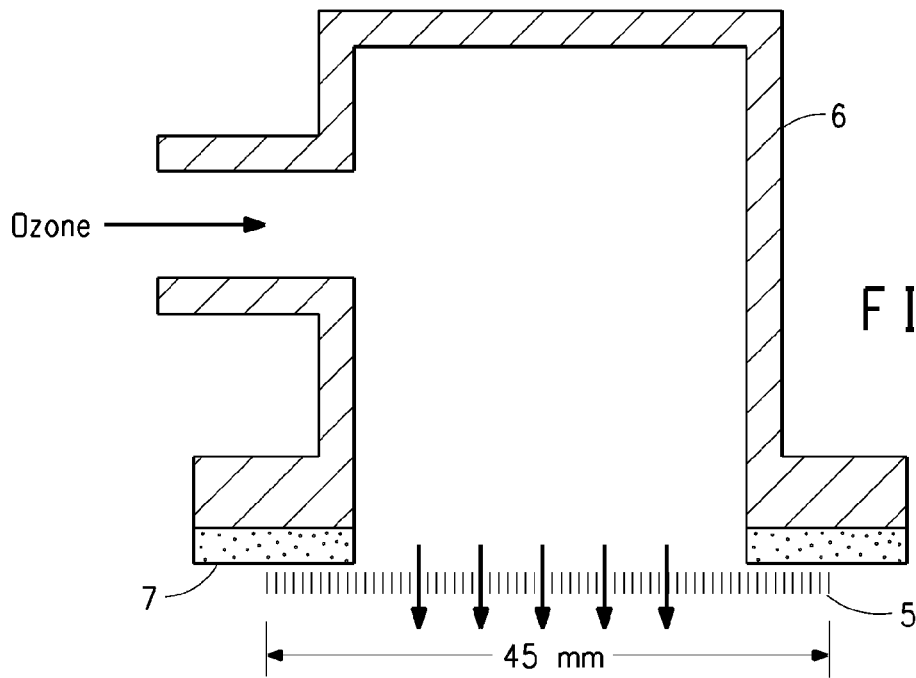
FIG. 1B is a schematic diagram showing a membrane filter diffuser.

FIG. 1B shows a filter membrane 5 sealed over the opening of a Pyrex flange joint 6 with silicone adhesive 7 so that ozone diffuses through the membrane 5.

Decreasing the thickness of the liquid layer between the membrane and the non-recessed areas allows for increased selectivity for removal of adsorbed organic compositions from the non-recessed areas. Selectivity is also enhanced by maintaining contact of the diffuser with substrate surface only for such time as is necessary to effect the desired amount of removal of the adsorbed organic materials from the non-recessed areas. Prolonged contact of the diffuser with the substrate surface may lead to undesirable loss of MPS from the recessed areas as well.

The difference in oxidation rates of organic species adsorbed onto non-recessed vs. recessed areas can also be increased by decreasing the diffusion rate of the active species through the hydrophilic solution. One way to accomplish this is to increase the viscosity of the solution, for example by choice of solvent used in the hydrophilic solution.

Another way to increase the difference in oxidation rates of organic species adsorbed onto non-recessed vs. recessed areas is to add reagents that are known to increase the rate of ozone decomposition so as to deplete the concentration of oxidizing agents (ozone and free radicals) that survive long enough to diffuse to the recessed features. Examples of such reagents are strong bases, primary alcohols and certain transition metal ions (e.g., copper ions). Yet another way to increase the difference in oxidation rates is to add radical scavengers at a sufficient concentration to compete with diffusion of the radicals to the recessed features.

EXAMPLES

Analysis of Cu Surfaces by Cyclic Voltammetry and XPS

Cyclic voltammetry measurements (EG&G PARC, Princeton, N.J., Model 173 potentiostat and Model 175 programmer) were made at a scan rate of 10 mV/sec, operating at potentials between −0.40V and −1.00 V versus $Hg/HgSO_4$. For this purpose, selected areas of the wafer were masked by applications of a 2.5 cm square piece of Teflon® tape with a round opening 1 cm in diameter (0.785 cm²). A pyrex flange joint 7 cm long with a 2 cm O-ring was centered over the hole in the tape mask and clamped onto the wafer to form a cylindrical cell with liquid-tight seal. 10 ml of electrolyte solution was added to the cell. The electrolyte is an acid Cu plating bath comprising an aqueous solution of $CuSO_4$, $H_2SO_4$, Viaform DF75 suppressor (a water soluble polyether) and HCl. A $Hg/HgSO_4$ reference electrode (Radiometer Analytical SAS, Villeurbanne, France, Model Ref 601) was inserted into the cell along with a Cu foil counter electrode. An electrical connection was made to the surface of the wafer outside the area of the cell and connected to the potentiostat as the working electrode. This provides a means to detect the presence of MPS on a Cu surface.

X-ray photoelectron spectroscopy (XPS) was used to analyze the surfaces.

Example 1

Topographically Selective Removal of MPS

A Cu-coated topographically patterned test wafer (854 CMP test wafer, ATDF Wafer Services, 2706 Montopolis Drive, Austin, Tex.) was mounted on a spin-coater (Headway Research, Inc., Garland, Tex., Model PWM32) and treated at 300 rpm with reagents in the following sequence: DI (de-ionized) water; 10 ml of 5% $H_2SO_4$; DI water; 10 ml 0.1% MPS (3-mercapto-1-propane sulfonic acid) in 5% $H_2SO_4$; and DI water. The MPS-coated wafer was then dried at 1000 rpm.

Figure 3A:
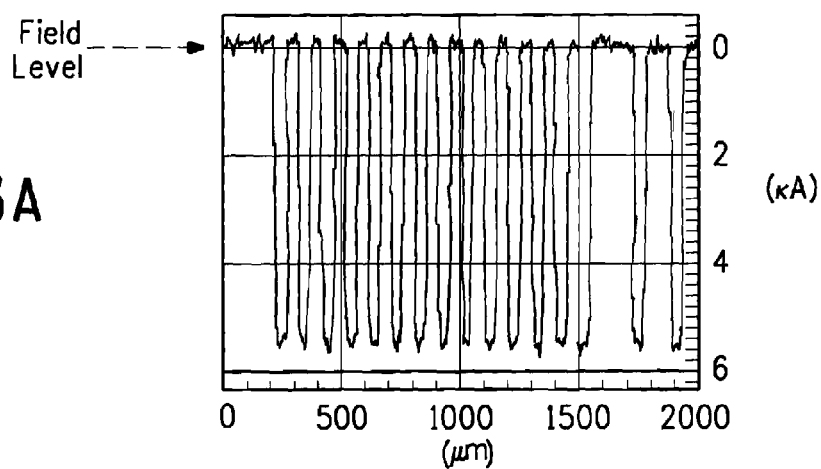
FIG. 3A is a profile across an array of 50 micron circuit features on an 854 CMP test wafer before oxidation.
Figure 3B:
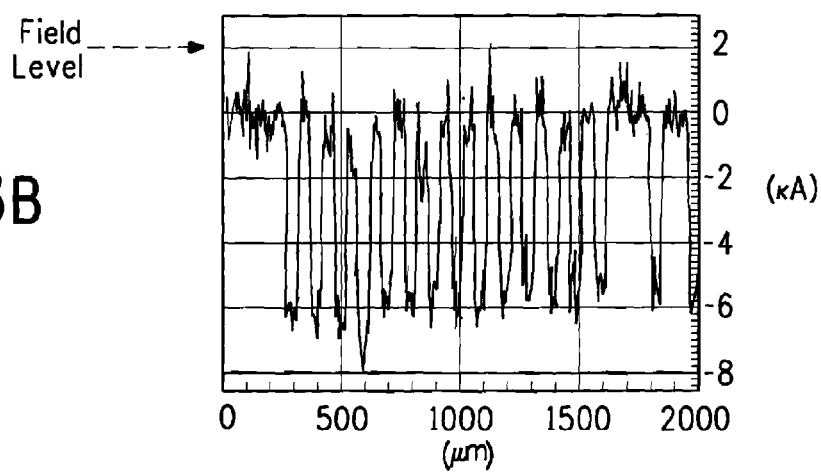
FIG. 3B is a profile across an array of 50 micron circuit features on an 854 CMP test wafer after ECD without oxidation.
Figure 3C:
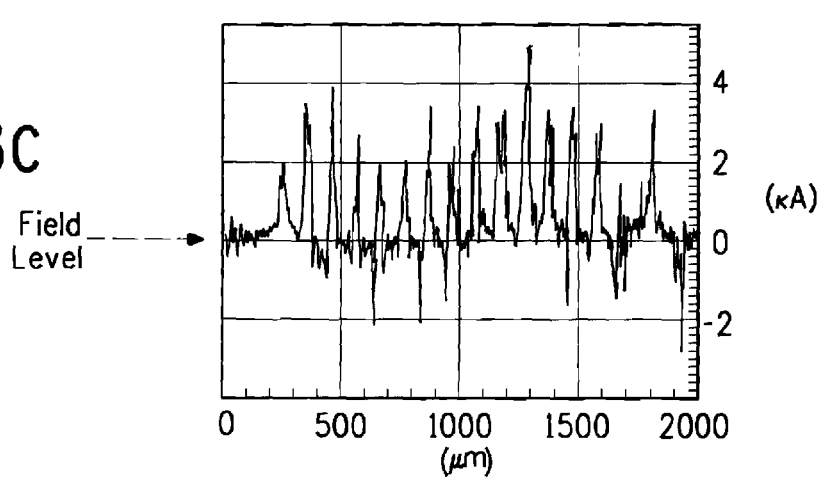
FIG. 3C is a profile across an array of 50 micron circuit features on an 854 CMP test wafer after topographically selective oxidation of MPS, followed by ECD.

This wafer contained circuit features of various dimensions recessed by 550 nm relative to the surrounding field areas. FIG. 3A shows the profile of an array of circuit features 50 microns wide. The wafer was spin-coated at 1000 rpm with a solution of 15% triethanolamine (Fluka) in a mixture of 75% ethanol, 25% water containing 0.1% of the non-ionic surfactant pluronic L-81 (BASF). A compliant hydrophobic diffuser was constructed by sealing a 39 mm PTFE filter membrane (Millipore FHLP) over the open end of a 40 mm glass tube with silicone rubber adhesive. The tube was attached to a supply of humidified ozone adjusted to supply a flow rate of 2.1 liter/min through the diffuser. The modest hydrostatic pressure from the ozone caused the diffuser to expand slightly from the end of the tube. The wafer, still mounted on the spin-coater, was rotated at 20 rpm and the diffuser was pressed against the surface of the wafer for 50 seconds providing an area of processing 2 cm in diameter. The wafer was rinsed with de-ionized water to remove triethanolamine leaving no visible change in appearance of the surface profile relative to un-processed areas. The wafer was mounted in a simple electroplating cell comprising a 50 mm pyrex flange joint filled with an acid Cu plating bath comprising an aqueous solution of $CuSO_4$, $H_2SO_4$, Viaform DF75 suppressor and HCl and fitted with a $Hg/HgSO_4$ reference electrode and Cu anode. ECD was performed at a potential of −0.709 V versus $Hg/HgSO_4$ and terminated after passage of 1.35 coulombs/cm², representing deposition of Cu to an average thickness of 500 nm. FIG. 3C shows the profile across the array of 50 micron circuit features. As a consequence of the topographically selective removal of MPS from the field areas, ECD has selectively been deposited onto the recessed circuit features causing them to rise above the level of the surrounding field areas by 200 to 400 nm. For comparison, FIG. 3B shows a profile following ECD on an area of the wafer activated with MPS but not oxidized. In this area, the surface roughness has increased, but there is no change in the relative elevation of field areas and recessed features. These results demonstrate that the preferential addition of Cu into recessed features of FIG. 3B is a direct consequence of selective removal of MPS by means of the invention.

While it is not intended that the invention be bound by any particular mechanism or theory, it is believed the thickness of the liquid layer can influence the rate of oxidation of the organic compound via at least two distinct mechanisms. In a first mechanism, when the flux of ozone diffusing to the surface is sufficiently low, the rate of oxidation becomes diffusion-controlled. Under diffusion control, the rate of oxidation equals the diffusive flux, which decreases with the thickness of the liquid layer. Two factors that favor diffusion control are converting ozone to more reactive free radicals, and decreasing the diffusive flux by increasing the viscosity of the liquid layer. A different mechanism may obtain when the rate of ozone decomposition competes with the diffusive flux. In that case, the amount of oxidizing agents (ozone and reactive radicals) which survive long enough to reach the surface decreases with increasing thickness of the liquid layer. This effect can be enhanced by increasing the rate of ozone decomposition and/or by increasing the viscosity of the liquid layer. By exploiting such mechanisms whereby the oxidation rate decreases with increasing liquid layer thickness, organic material may be oxidized and removed from non-recessed areas covered by a thin liquid layer faster than it is removed in recessed areas covered by a thicker liquid layer.

Example 2

Effect of MPS Removal on Cu ECD

Figure 2:
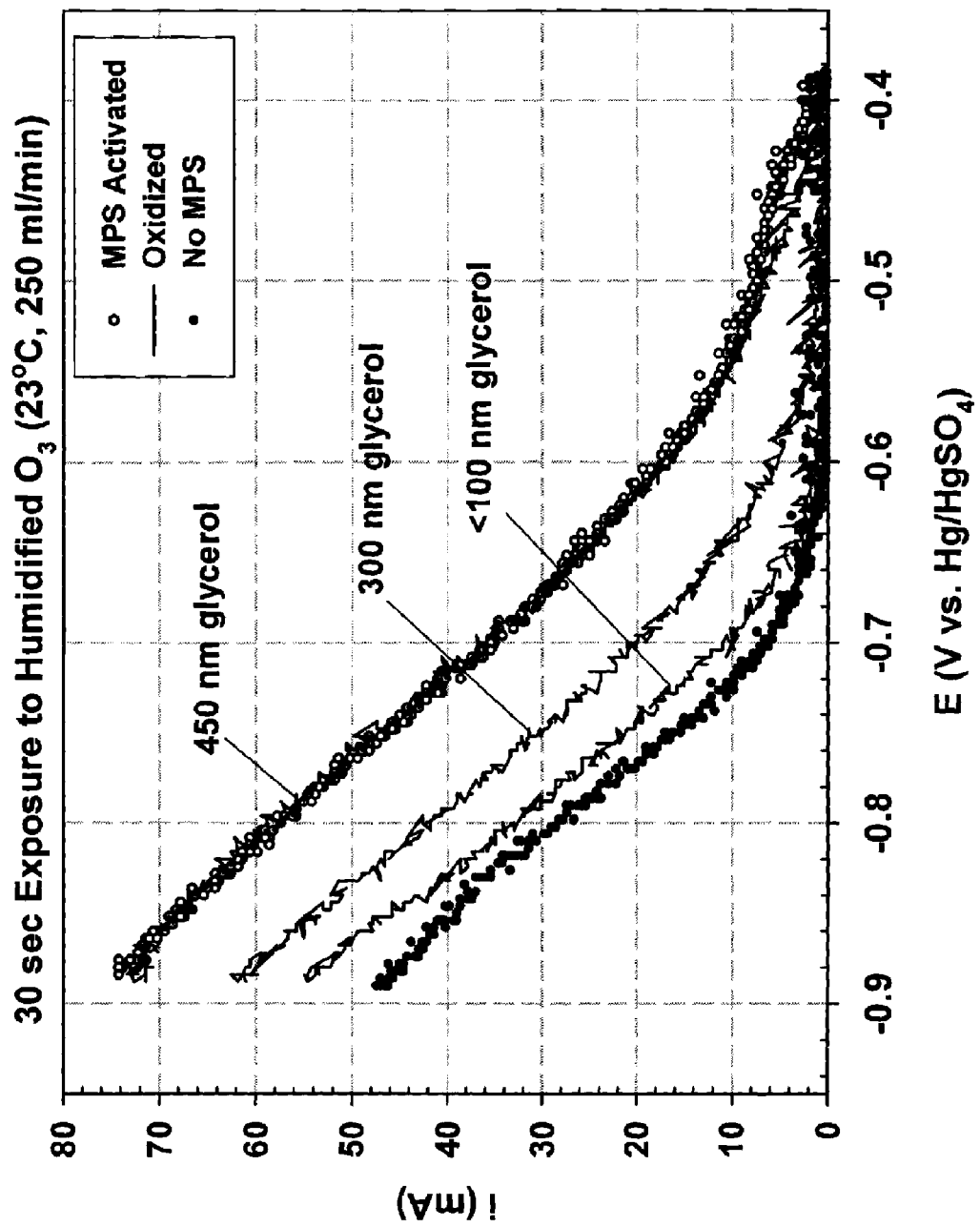
FIG. 2 is a graph of cyclic voltammograms showing the effects of MPS on ECD current i as a function of applied potential E.

An unpatterned wafer covered with 160±3 nm of Cu was activated with MPS as in Example 1. A circular area 4 cm in diameter was oxidized following the procedure of Example 1. Cyclic voltammetry indicated more than 85% of the MPS had been removed but there was no detectable change in the thickness of Cu. ECD was then used to deposit additional Cu over an area 12.6 $cm^2$ encompassing both untreated and oxidized portions of the wafer following the same procedure as Example 1. Following ECD, the final thickness of Cu in the un-treated, MPS-activated area was 880 nm while the thickness in the area that had been oxidized prior to ECD was 374 nm. The growth in Cu thickness in the two areas (720 versus 214 nm) indicates that Cu deposited 3.4 times faster in the un-treated areas as in the areas oxidized by means of the invention. This ratio is consistent with the currents observed in cyclic voltammetry for MPS-saturated wafers before and after oxidation as illustrated in FIG. 2, and indicates most of the MPS had been removed by the oxidation process.

What is claimed is:

1. A process for selectively removing adsorbed organic compositions from non-recessed areas of a topographically patterned substrate comprising recessed and non-recessed areas, comprising:
   a. coating the topographically patterned substrate with a liquid hydrophilic solution comprising water and one or more solvents selected from the group consisting of alcohols, polyols, amines and polyamines so that the solution forms a flat surface over the substrate; and
   b. exposing the surface of the liquid hydrophilic solution to ozone.

2. The process of claim 1, wherein the liquid hydrophilic solution is coated onto the substrate by spin-coating.

3. The process of claim 1, wherein the liquid hydrophilic solution has a viscosity greater than 10 centipoise.

4. A process for selectively removing adsorbed organic compositions from non-recessed areas of a topographically patterned substrate comprising recessed and non-recessed areas, comprising:
   a. coating the topographically patterned substrate with a sufficient amount of a liquid hydrophilic solution to at least fill the recessed areas and to cover the non-recessed areas, wherein the solution has a viscosity greater than 10 centipoise;
   b. providing a hydrophobic ozone diffuser comprising:
      i. a vessel enclosing a volume that is at least partially filled with ozone gas, and
      ii. an ozone-permeable membrane which forms a surface of the vessel,
      wherein the membrane has an inner surface and an hydrophobic outer surface, and the inner surface is in contact with the ozone gas in the vessel; and
   c. contacting the coated topographically patterned substrate with the outer surface of the ozone-permeable membrane of the diffuser in such a way as to form a layer of liquid hydrophilic solution less than 400 nm thick between the membrane and the non-recessed areas of the substrate; and
   d. delivering ozone through the membrane to the non-recessed areas.

5. The process of claim 4, wherein the liquid hydrophilic solution comprises tetramethylammonium hydroxide and at least one solvent selected from the group consisting of water, ethanol, and triethanolamine.

6. The process of claim 4, wherein the liquid hydrophilic solution has a pH of greater than 6.5.

7. The process of claim 4, wherein the ozone-permeable membrane comprises PTFE or a PTFE-coated membrane filter.

8. The process of claim 4, wherein the organic composition is MPS.

9. The process of claim 4, wherein the thickness of the layer of solution between the membrane and the non-recessed areas is less than 200 nm.

10. The process of claim 4, wherein the diffuser is in dynamic contact with the coated substrate such that the diffuser moves across the surface of the substrate while maintaining a constant thickness of liquid layer between the non-recessed areas and the membrane.

* * * * *